United States Patent
Kwack

(10) Patent No.: US 7,855,033 B2
(45) Date of Patent: Dec. 21, 2010

(54) PHOTO MASK AND METHOD OF FABRICATING ARRAY SUBSTRATE FOR LIQUID CRYSTAL DISPLAY DEVICE USING THE SAME

(75) Inventor: Hee-Young Kwack, Seoul (KR)

(73) Assignee: LG Display Co., Ltd., Seoul (KR)

( * ) Notice: Subject to any disclaimer, the term of this patent is extended or adjusted under 35 U.S.C. 154(b) by 692 days.

(21) Appl. No.: 11/639,744

(22) Filed: Dec. 15, 2006

(65) Prior Publication Data
US 2007/0141481 A1 Jun. 21, 2007

(30) Foreign Application Priority Data
Dec. 21, 2005 (KR) .................... 10-2005-0126809

(51) Int. Cl.
*G03F 1/00* (2006.01)
(52) U.S. Cl. .................... 430/5; 430/311; 430/394; 349/43; 349/139; 349/113
(58) Field of Classification Search .................... 430/5; 349/43, 139, 113
See application file for complete search history.

(56) References Cited

U.S. PATENT DOCUMENTS

| | | | |
|---|---|---|---|
| 4,556,608 A * | 12/1985 | Kaneki et al. | 430/5 |
| 5,786,113 A * | 7/1998 | Hashimoto et al. | 430/5 |
| 2005/0227395 A1* | 10/2005 | Jeoung et al. | 438/30 |

FOREIGN PATENT DOCUMENTS

| JP | 2002-141512 | 5/2002 |
|---|---|---|
| KR | 10-2005-0067802 | 7/2005 |

OTHER PUBLICATIONS

Office Action issued in corresponding Japanese Patent Application 2006-332789; issued Oct. 30, 2009.

* cited by examiner

*Primary Examiner*—Mark F Huff
*Assistant Examiner*—Rashid Alam
(74) *Attorney, Agent, or Firm*—Brinks Hofer Gilson & Lione

(57) ABSTRACT

A photo-mask used for fabricating a photoresist pattern in process of fabricating an array substrate for a liquid crystal display device comprises a transmissive area having a first transmittance; a blocking area having a second transmittance; a first half-transmissive area including at least one coating layer and having a third transmittance; a second half-transmissive area including a plurality of bars and having a fourth transmittance, the bars having spaces therebetween, wherein the third and fourth transmittances are less than the first transmittance and greater than the second transmittance, respectively, and the third transmittance is greater than the fourth transmittance.

12 Claims, 10 Drawing Sheets

__US 7,855,033 B2__

PHOTO MASK AND METHOD OF FABRICATING ARRAY SUBSTRATE FOR LIQUID CRYSTAL DISPLAY DEVICE USING THE SAME

The present application claims the benefit of Korean Patent Application No. 2005-0126809 filed in Korea on Dec. 21, 2005, which is hereby incorporated by reference.

TECHNICAL FIELD

The present disclosure relates to a liquid crystal display device, and more particularly, to a photo mask and a method of fabricating an array substrate for a liquid crystal display device using the same.

BACKGROUND

Since liquid crystal display (LCD) devices have low power consumption and a high mobility, they have been touted as the next generation display device. Among LCD devices, active matrix type LCD devices, which have high resolution and are effective at displaying moving images, are widely used.

In general, LCD devices are fabricated through an array substrate process, a color filter substrate process, and a cell process. In the array substrate process, a thin film transistor (TFT) and a pixel electrode may be formed on a first substrate. In the color filter substrate process, a color filter and a common electrode may be formed on a second substrate. In the cell process, a liquid crystal layer is formed between the first and second substrates.

An LCD device is shown in detail in FIG. 1A. FIG. 1A is an exploded perspective view of a conventional LCD device. As shown, the first and, second substrates 12 and 22 face each other, and the liquid crystal layer 30 is interposed therebetween. The first substrate 12 includes a plurality of gate lines 14, a plurality of data lines 16, a plurality of TFTs ("Tr"), a plurality of pixel electrodes 18, and so on. The gate line 14 and the data line 16 cross each other such that a region formed between the gate and data lines 14 and 16 is defined as a pixel region ("P"). The TFT "Tr" is formed at a crossing portion between the gate and data lines 14 and 16, and the pixel electrode 18 is formed in the pixel region "P" and connected to the TFT "Tr."

The second substrate 22 includes a black matrix 25, the color filter 26, and the common electrode 28, and so on. The black matrix 25 has a lattice shape to cover a non-display region, such as the gate line 14, the data line 16, the TFT "Tr," and so on. The color filter 26 is formed within the black matrix 25 and corresponds to the pixel region "P." The color filter 26 includes red, green, and blue colors. The common electrode 28 is formed on the black matrix 25 and the color filter 26 over an entire surface of the second substrate 22. The common electrode 28 may be made of transparent material.

Though not shown, a sealant is formed between edges of the first and second substrates 12 and 22. First and second alignment layers may be formed between the first substrate 12 and the liquid crystal layer 30 and between the second substrate 22 and the liquid crystal layer 30, and a polarizing plate may be formed on an outer surface of the first substrate 12 or the second substrate 22. Also, a backlight assembly below the first substrate 12 supplies light into the liquid crystal layer 30. The liquid crystal layer 30 is driven by an electric field between the pixel electrode 18 and the common electrode 28 such that the LCD device displays images.

In a conventional method of fabricating the LCD device, and more particularly, in a method of fabricating the array substrate, a mask process is used for patterning the data and gate lines, the pixel electrode, and so on. Since the mask process includes many steps, such as a step of coating a photoresist, a step of developing, a step of etching, a step of stripping, and so on, a production time increases and production yield decreases. Accordingly, a new method of fabricating the array substrate for the LCD device, referred to as 4 mask process, has been suggested to resolve these problems. The conventional method of fabricating the array substrate includes 5 mask processes.

FIGS. 2A to 2C show cross-sectional views of processes of fabricating the pixel region of the array substrate using the 4 mask process.

As shown in FIG. 2A, a gate electrode 55, the gate line (not shown), a gate insulating layer 57, the data line 65, an active layer 60a of intrinsic amorphous silicon, an ohmic contact pattern 61 of impurity-doped amorphous silicon, a source-drain pattern 66, a passivation layer 75, and a transparent conductive material layer 78 are formed on the first substrate 50.

The gate electrode 55 and the gate line (not shown) are formed on the first substrate 50 in the switching region TrA by depositing and patterning a first metal layer (not shown) using a first mask (not shown). The gate electrode 55 may be extended and may protrude from the gate line (not shown). The gate insulating layer 57 is formed on the first substrate including the gate electrode 55 and the gate line (not shown). Though not shown, an intrinsic amorphous silicon layer, an impurity-doped amorphous silicon layer, and a second metal layer are formed on the gate insulating layer 57. And then, the active layer 60a, the ohmic contact pattern 61, and the source-drain pattern 66 are formed by sequentially patterning the intrinsic amorphous silicon layer, the impurity-doped amorphous silicon layer, and the second metal layer using a second mask (not shown). At the same time, the data line 65 is formed from the second metal layer. The gate insulating layer 57, an intrinsic amorphous silicon pattern 62a, and an impurity-doped amorphous silicon pattern 62b are formed between the data line 65 and the first substrate 50.

Next, the passivation layer 75 having a drain contact hole 76 is formed on the source-drain pattern 66 by depositing and patterning an inorganic material layer (not shown) by using a third mask (not shown). The drain contact hole 76 partially exposes the source-drain pattern 66. The transparent conductive material layer 78 is formed on the passivation layer 75 and contacts the source-drain pattern 66 through the drain contact hole 76. Then, a photoresist (PR) layer 85 having a first height h1 from the first substrate 50 is formed on the transparent conductive metal layer 78, and a fourth mask 91 is disposed over the PR layer 85. The fourth mask 91 has a transmissive area "TA," a blocking area "BA," and a half-transmissive area "HTA." The half-transmissive area "HTA" has a transmittance less than the transmissive area TA and greater than the blocking area "BA." Then, the PR layer 85 is exposed by light through the fourth mask 91.

As shown in FIG. 2B, first and second PR patterns 85a and 85b are formed on the transparent conductive metal pattern 78 by developing the PR layer 85. The first PR pattern 85a corresponds to the blocking area BA to have the first height hi from the first substrate 50, and the second PR pattern 85b corresponds to the half-transmissive area "HTA" to have the second height h2 from the first substrate 50, which is less than the first height h1. The PR layer 85 corresponding to the transmissive area TA is completely removed such that the transparent conductive material pattern 78 corresponding to the gate electrode 55 is exposed between the second PR patterns 85b.

Since the transparent conductive material layer 78 has a step difference, the second PR pattern 85b has first, second, and third thicknesses t1, t2, and t3 from the transparent conductive metal layer 78. The second thickness t2 is greater than the first thickness t1 and less than the third thickness t3. The second PR pattern 85b in a first region A1 has the first thickness t1 due to the highest step from the gate electrode 55, the active layer 60a, the ohmic contact pattern 61, and the source-drain pattern 66. The second PR pattern 85b in a second region A2 has the second thickness t2 due to a middle step without the gate electrode 55, and the second pattern 85b in a third region A3 has the third thickness t3 due to the lowest step without the gate electrode 55, the active layer 60a, the ohmic contact pattern 61, and the source-drain pattern 66.

As shown in FIG. 2C, the transparent conductive material layer 78 exposed between the second PR patterns 85b is removed. Sequentially, the source-drain pattern 66 and the ohmic contact pattern 61 exposed by removing the transparent conductive material layer 78 are removed such that a source electrode 67, a drain electrode 69, and an ohmic contact layer 60b are formed. The ohmic contact layer 60b and the active layer 60a are as a semiconductor layer 60. Next, the second PR pattern 85b is removed from the transparent conductive metal pattern 78 by ashing. At the same time, the first PR pattern 85a is partially removed. The ashing should be perfectly performed to expose the transparent conductive metal layer 78 until the second PR pattern 85b in the third region A3 is perfectly removed.

In this case, before the ashing is finished, the second PR pattern 85b having the first thickness t1 or/and the second thickness t2 is exposed. Accordingly, since the ashing time increases as much as an ashing time of different thickness between the first and second thickness t1 and t2 or between the second and third thickness t2 and t3, the production time of the array substrate increases.

BRIEF SUMMARY

Accordingly, the present disclosure is directed to a photo-mask and a method of fabricating an array substrate for an LCD device using the photo-mask that may substantially obviate one or more of the problems due to limitations and disadvantages of the related art.

The photo-mask used for fabricating a photoresist pattern in process of fabricating an array substrate for a liquid crystal display device comprises a transmissive area having a first transmittance; a blocking area having a second transmittance; a first half-transmissive area and having a third transmittance; a second half-transmissive area and having a fourth transmittance, wherein the third and fourth transmittances are less than the first transmittance and greater than the second transmittance, respectively, and the third transmittance is greater than the fourth transmittance.

In another aspect, a method of fabricating an array substrate for a liquid crystal display device comprises forming a gate line and a gate electrode on a substrate by depositing and patterning a first metal layer; forming a gate insulating layer on the gate line and the gate electrode; forming an active layer, an ohmic contact pattern, source-drain pattern, and a data line by sequentially depositing and patterning an intrinsic amorphous silicon layer, an impurity-doped amorphous silicon pattern, a second metal layer, wherein the active layer, the ohmic contact pattern, and a source-drain pattern corresponds to the gate electrode; forming a passivation layer including a drain contact hole on the source-drain pattern, the drain contact hole exposing a part of the source-drain pattern; forming a transparent conductive metal layer on the passivation layer; forming a photoresist layer on the transparent conductive metal layer; disposing a photo-mask having a transmissive area, a blocking area and first and second half-transmissive areas over the photoresist layer, wherein the first and second half-transmissive areas has transmittances less than the transmissive area and greater than the blocking area, and the first half-transmissive area has the transmittance greater than the second half-transmissive area; forming first, second, and third photoresist patterns from the photoresist layer on the transparent conductive metal layer such that the transparent conductive metal layer corresponding to the gate electrode is exposed by the first, second, and third photoresist patterns,; removing the second and third photoresist patterns from the transparent conductive metal layer by ashing; removing the transparent conductive metal layer exposed by removing the second and third photoresist patterns.

It is to be understood that both the foregoing general description and the following detailed description are exemplary and explanatory and are intended to provide further explanation of the invention as claimed.

DETAILED DESCRIPTION

Reference will now be made in detail to the preferred embodiments, examples of which are illustrated in the accompanying drawings.

Figure 1A:
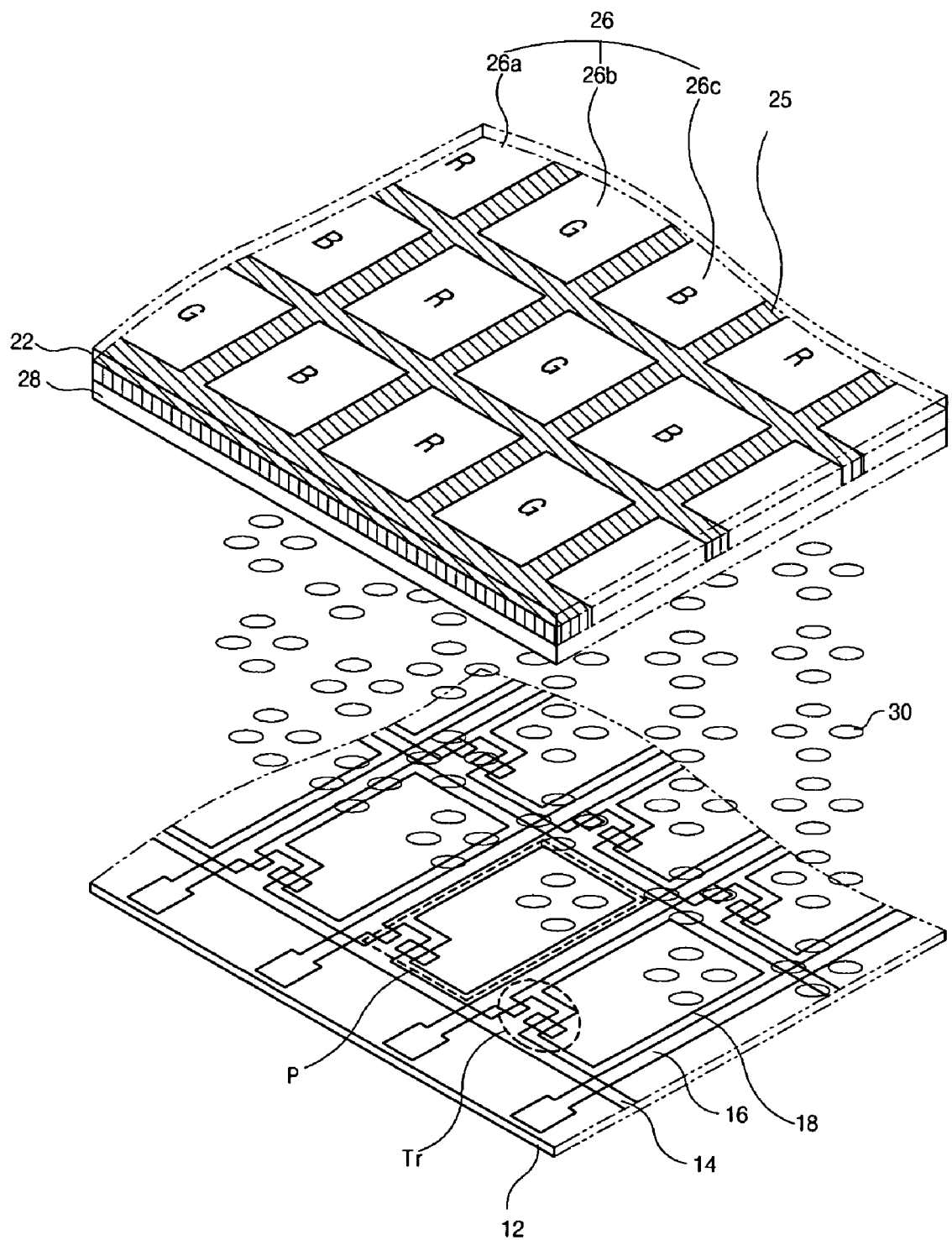
FIG. 1A is an exploded perspective view of a conventional LCD device.
Figure 2A:
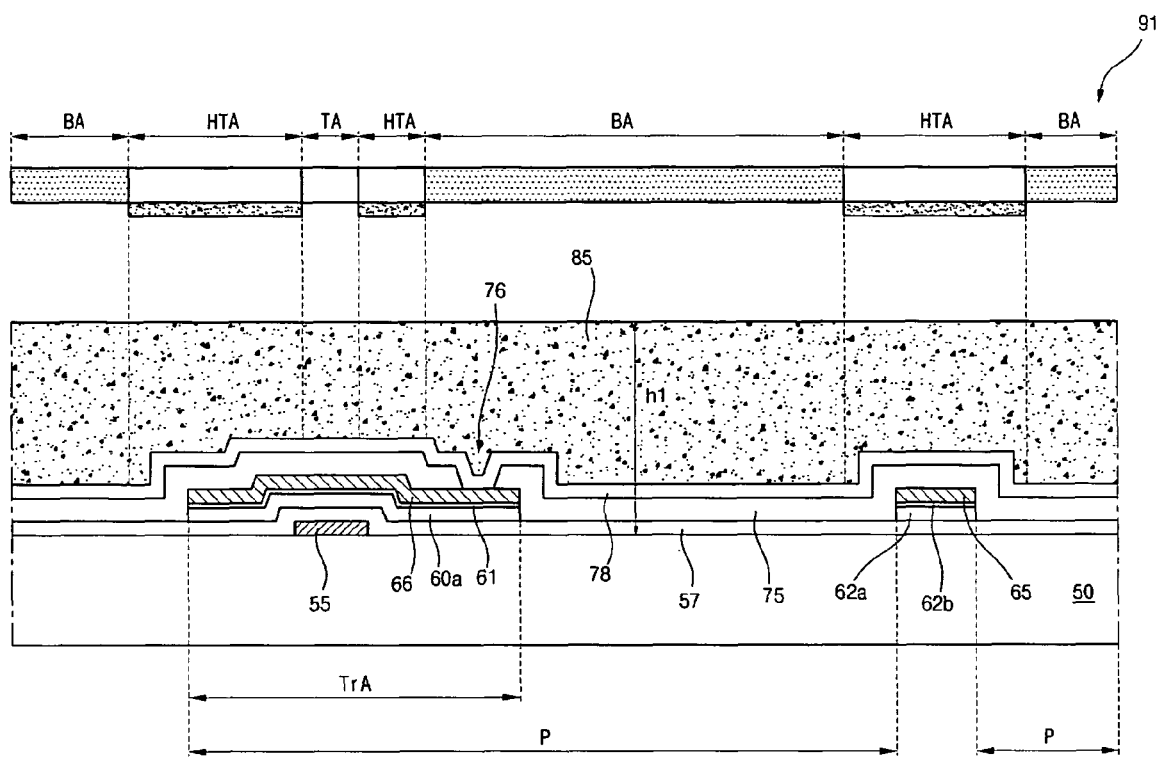
FIGS. 2A and 2C are cross-sectional views showing processes of fabricating an array substrate for an LCD device according to the related art.
Figure 2B:
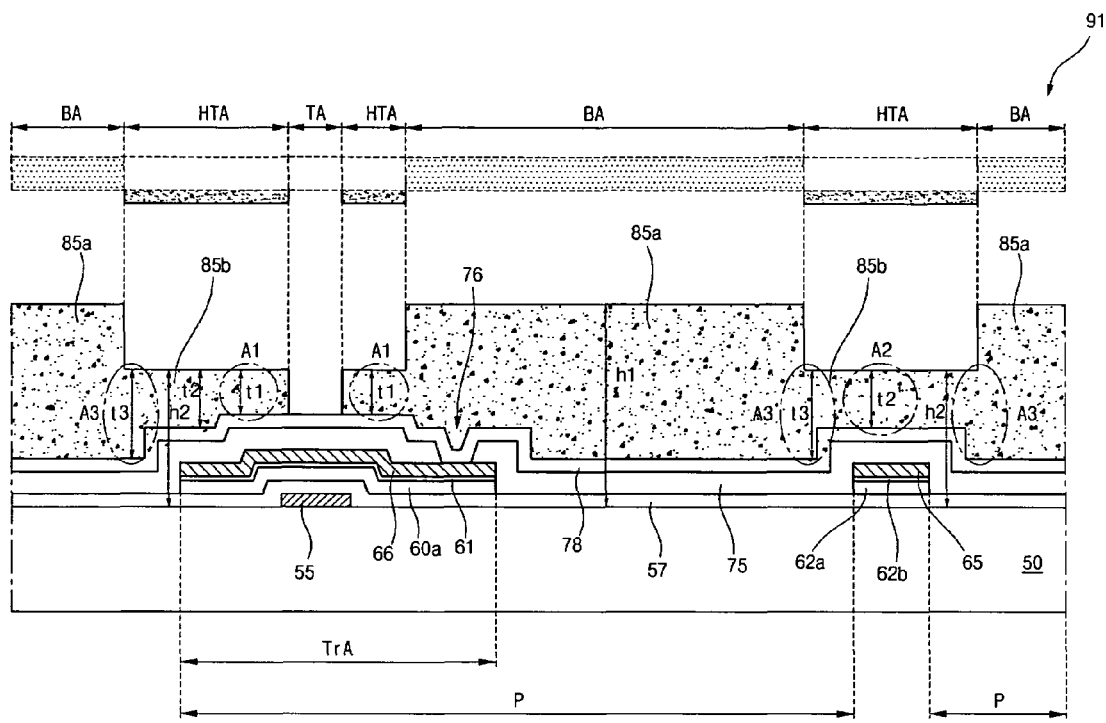
Figure 2C:
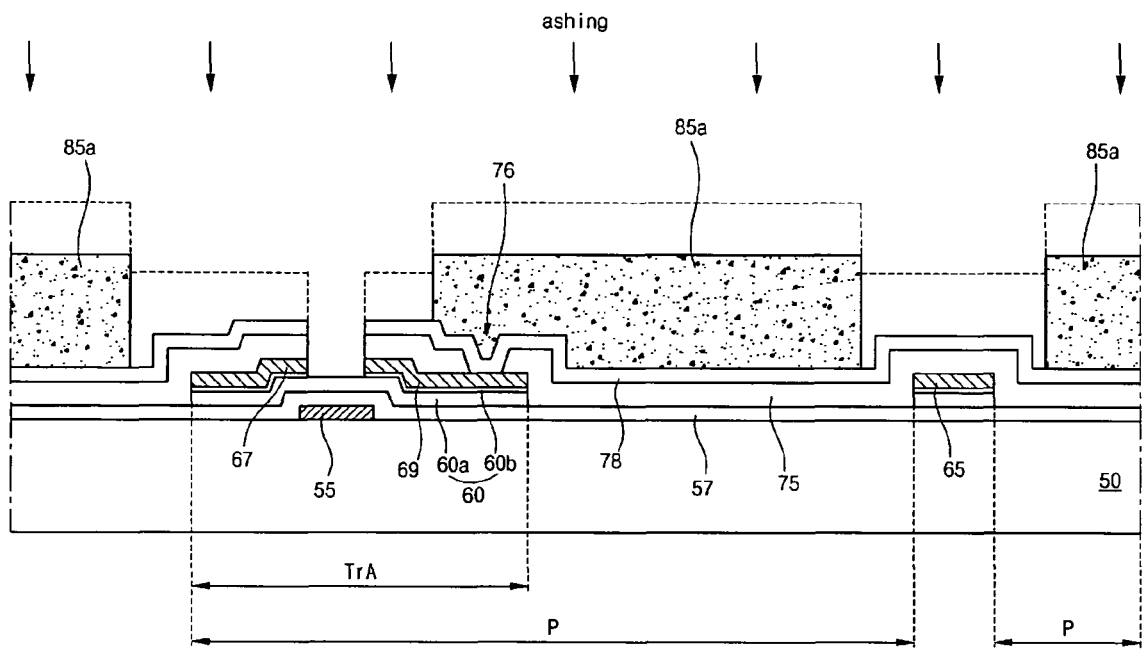
Figure 3:
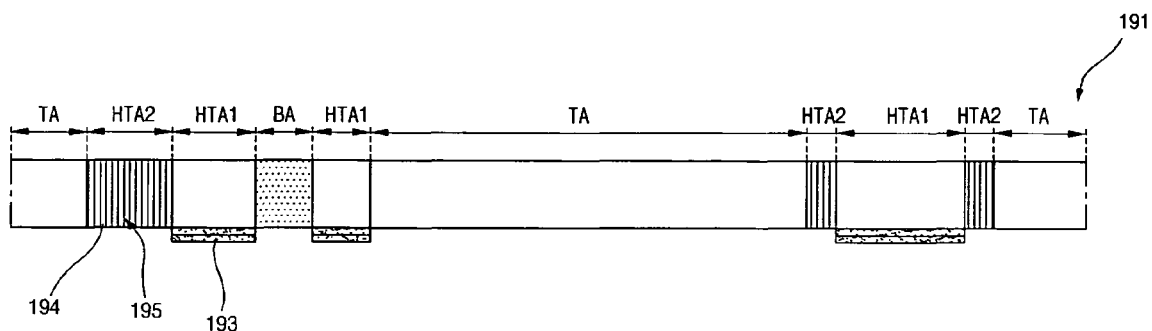
FIG. 3 is a cross-sectional view of a photo-mask according to the present disclosure.

FIG. 3 is a cross-sectional view of a photo-mask that is used for fabricating an array substrate for an LCD device according to the present disclosure. As shown, the photo-mask includes a transmissive area "TA," a blocking area "BA," a first half-transmissive area "HTA1," and a second half-transmissive area "HTA2." The transmissive area TA may have a transmittance of 100 percent, and the blocking area BA may have a transmittance of 0 percent. The first and second half-transmissive areas HTA1 and HTA2 each have a different transmittance from the transmissive area TA and the blocking area BA.

The first half-transmissive area HTA1 may have a transmittance of between 50 percent and 60 percent and may be a half-tone type. Alternatively, the first half-transmissive area HTA2 may be a multi-slit type. The second half-transmissive area HTA2 may have a transmittance of between 20 percent and 40 percent and may be a multi-slit type. Alternatively, the second half-transmissive area HTA2 may be a half-tone type. The half-tone type is formed by disposing at least one coating layer 193 on an upper surface or a lower surface of the photo-mask 191. The coating layer 193 absorbs incident light such that the transmittance of light may be controlled. Accordingly, when the coating layer 193 includes several coating layers or has an increased thickness, the transmittance of, for example, the first half-transmissive area may be less than the first half-transmissive area having a single coating layer. The multi-slit type may be formed by a plurality of bars 195. The bars 195 include gaps between the bars, and each gap between the bars 195 is defined as a space or slit 194. Light passes through the slit 194. preferably, each bar 195 perfectly blocks light and has a predetermined width. The light passing through the slit 194 is diffracted such that the light reaches a region corresponding to the bars 195. Since the bars 195 absorb light, the transmittance becomes lower with the bars 195 than without the bars 195. Also, as a distance between the slits 194 becomes more narrow or the bars are increased in width, the transmittance of, for example, the second half-transmissive area HTA2, may be reduced.

All of the first and second half-transmissive areas may be formed of the coating layer. However, in this case, it may be difficult to appropriately control the thickness of the coating layer. Also, when the first half-transmissive area has a single layer and the second half-transmissive area has multiple layers, the difference in transmission between the first and second half-transmissive areas may be too great. Alternatively, the first and second half-transmissive areas may be formed of the multi-slits by controlling gaps between slits or widths of the bars. In this case, however, the photo-mask may be useful for only the smaller size, not the bigger size. Moreover, when the first and second half-transmissive areas are located adjacent to each other, the slits at a border between the first and second half-transmissive area may be affected by each other. Accordingly, it is preferable that the first half-transmissive area HTA1 in the present disclosure is made of the half-tone type, and the second half-transmissive area HTA2 in the present disclosure is made of the multi-slit type.

FIGS. 4A to 4G are cross-sectional views of a fabricating process of a pixel region of an array substrate using the above-mentioned photo-mask.

Figure 4A:
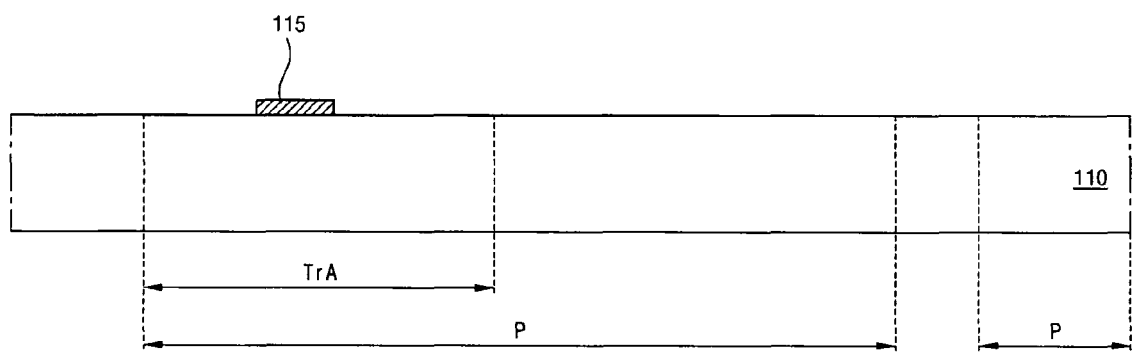
FIGS. 4A to 4H are cross-sectional views showing processes of fabricating an array substrate for an LCD device using a photo-mask according to the present disclosure.

A gate electrode 115 is formed on a substrate 110 by a first mask process as shown in FIG. 4A. The gate electrode 115 is formed on the substrate 110 in a switching region TrA by depositing and patterning a first metal layer (not shown) using a first mask (not shown). The substrate 110 includes a plurality of pixel regions "P" and a switching region TrA. In more detail, the first metal layer is formed on the substrate 110 by depositing a first metal or metal alloy. A first photoresist (PR) layer (not shown) is formed on the first metal layer, and the first mask having a transmissive area and a blocking area is disposed over the first PR layer. The first PR layer is exposed and developed to form a first PR pattern corresponding a center of the switching region TrA. The first metal layer exposed by the first PR pattern is removed such that the gate electrode 115 is formed on the substrate 110 in the switching region TrA. At the same time, a gate line (not shown) is formed on the substrate 110. The gate electrode 115 extends from the gate line into a pixel region P.

Figure 4B:
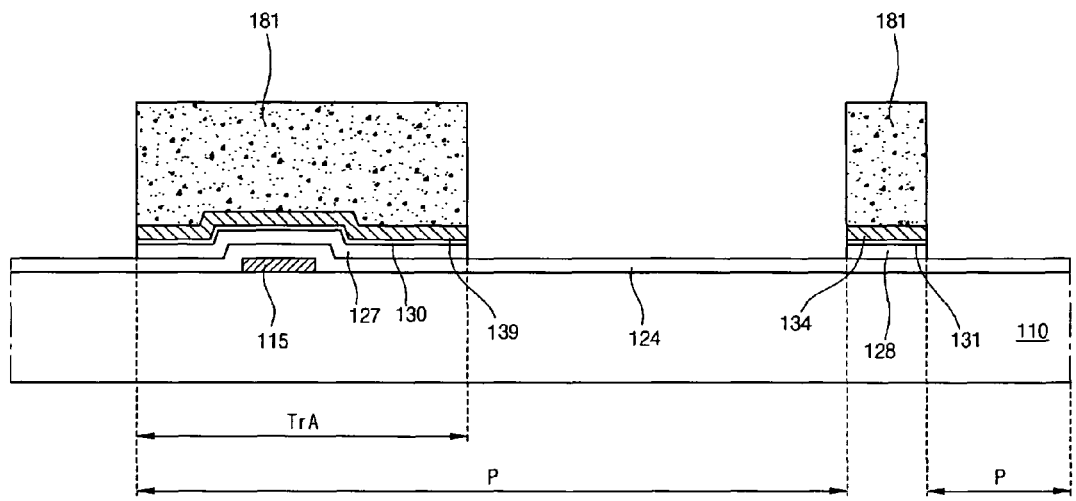

A second mask process is described by FIG. 4B. A gate insulating layer 124 is formed on the substrate 110 including the gate electrode 115 and the gate line by depositing an inorganic insulating material, such as silicon oxide or silicon nitride. Though not shown, an intrinsic amorphous silicon layer, an impurity-doped amorphous silicon layer, a second metal layer, and a second PR layer are sequentially formed on the gate insulating layer 124. Then, a second PR pattern 181 is formed on the second metal layer (not shown) by exposing and developing the second PR layer using the second mask (not shown). The second mask has a transmissive area and a blocking area. The second PR pattern 181 corresponds to the switching region TrA and a region in which a data line will be formed.

The second metal layer exposed within the second PR pattern 181 is removed, and the impurity-doped amorphous silicon layer below the second metal layer and the intrinsic amorphous silicon layer below the impurity-doped amorphous silicon layer are removed. As a result, a data line 134, a source-drain pattern 139, an ohmic contact pattern 130 and an active layer 127 are formed. The intrinsic amorphous silicon pattern 128 has the same material as the active layer 127, and the impurity-doped amorphous silicon pattern 131 has the same material as the ohmic contact pattern 130 between the substrate 110 and the data line 134. The second PR pattern 181 is removed from the source-drain pattern 139 and the data line 134.

Figure 4C:
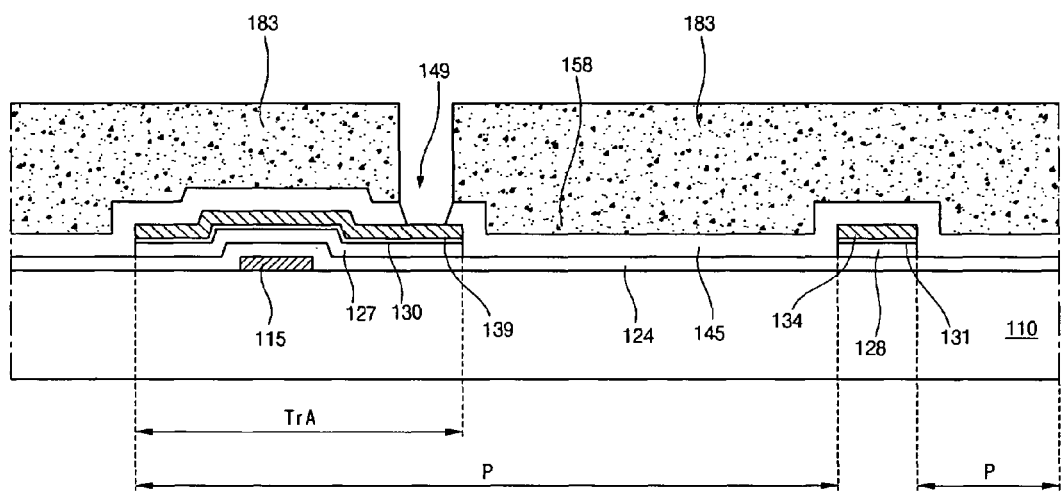

As shown in FIG. 4C, a passivation layer 145 is formed on the data line 134 and the source-drain pattern 139 by depositing an inorganic insulating material such as silicon oxide or silicon nitride. Though not shown, a third PR layer is formed on the passivation layer 145, and a third mask having the transmissive area and the blocking area is disposed over the third PR layer. Then, a third PR pattern 183 is formed on the passivation layer 145 by exposing and developing the third PR layer using the third mask. Also, a drain contact hole 149 exposing a part of the source-drain pattern 139 is formed by removing the passivation layer 145 using the third PR pattern 183 as a mask. The third PR pattern 183 is removed from the passivation layer 145.

Figure 4D:
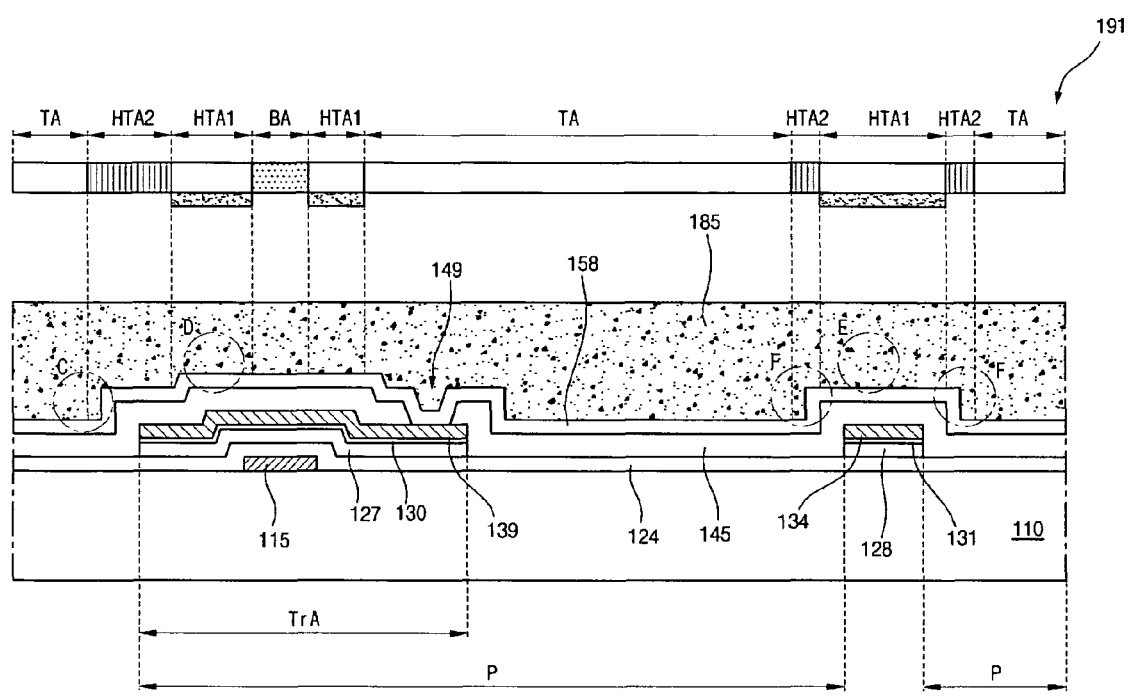

As shown in FIG. 4D, a transparent conductive material layer 158 is formed on the passivation layer 145 by depositing a transparent conductive material such as indium-tin oxide (ITO) or indium-zinc oxide (IZO). The transparent conductive material layer 158 contacts the source-drain pattern 139 through the drain contact hole 149. A fourth PR layer 185 is formed on the transparent conductive metal layer 158, and then the photo-mask 191 is disposed over the fourth PR layer 185. The fourth mask 191 has the transmissive area TA, the blocking area BA, and the first and second half-transmissive areas HTA1 and HTA2 as mentioned above. The fourth PR layer 185 is exposed and developed using the photo-mask 191. As mentioned above, the first and second half-transmissive areas HTA1 and HTA2 have transmittances less than the transmissive area TA and greater than the blocking area BA. The first half-transmissive area HTA1 may have a transmittance of between 50 percent and 60 percent, and the second half-transmissive area HTA2 may have a transmittance of between 20 percent and 40 percent. The first half-transmissive area HTA1 is the half-tone type, and the second half-transmissive area HTA2 is the multi-slit type.

The blocking area BA corresponds to the gate electrode 115, and the transmissive area TA corresponds to a region in which a pixel electrode is to be formed. The first half-transmissive area HTA1 corresponds to a region "D" and a region "E". The region "D" corresponds to the source-drain patterns 139 at both sides of the gate electrode 115. Accordingly, the first half-transmissive area HTA1 is located at both sides of the blocking area BA. The region "E" corresponds to the data line 134. The second half-transmissive area HTA2 corresponds to a region "C" and a region "F". The second half-transmissive area HTA2 of the region "F" is located at both sides of the first half-transmissive area HTA1 of the region "E". The second half-transmissive area HTA2 of the region "C" is located at a side of the first half-transmissive area HTA1 of the region "D". The second half-transmissive area HTA2 of the region "C" corresponds to a step resulting from the source-drain pattern 139.

Figure 4E:
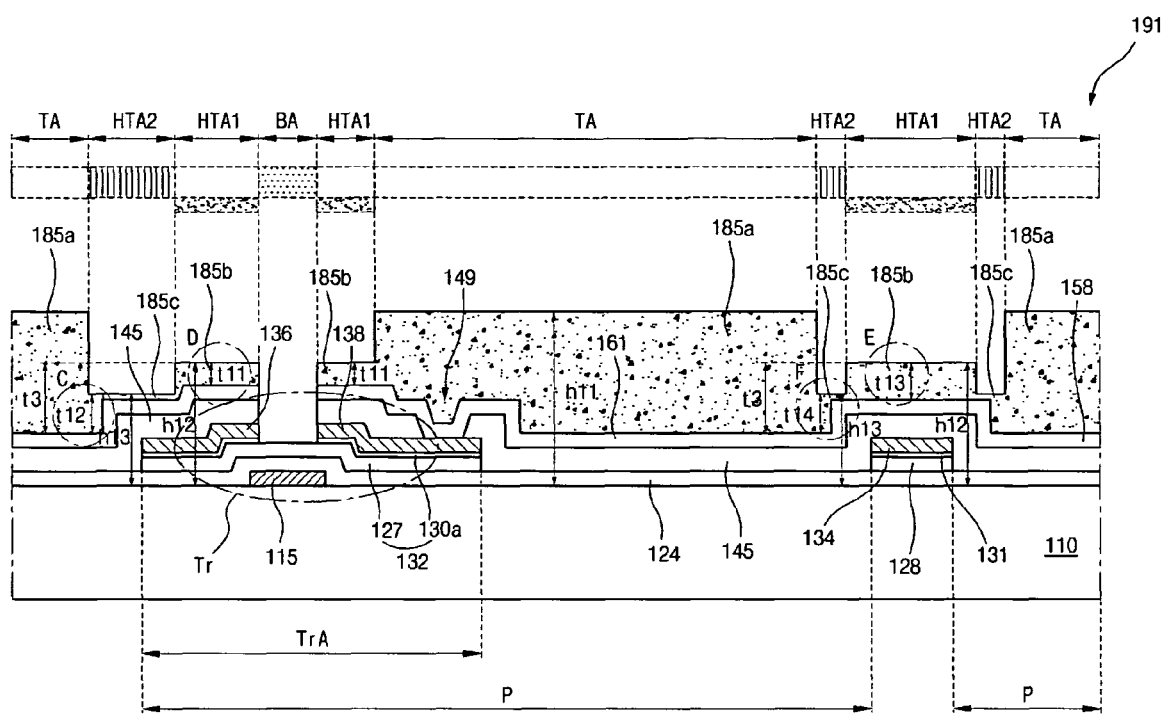

As shown in FIG. 4E, the fourth PR layer 185 is exposed and developed by using the photo-mask 191 such that three PR patterns, a fourth PR pattern 185*a*, a fifth PR pattern 185*b*, and a sixth PR pattern 185*c*, are formed on the transparent conductive material layer 158. The transparent conductive material layer 158 corresponding to the blocking area BA is exposed between the three PR patterns 185*a*, 185*b*, and 185*c*.

The fourth PR pattern 185a corresponds to the transmissive area TA of the photo-mask 191 and has a first height h11 from the substrate 110. The fifth PR pattern 185b corresponds to the first half-transmissive area HTA1 and has a second height h12 from the substrate 110. The sixth PR pattern 185c corresponds to the second half-transmissive area HTA2 and has a third height h13 from the substrate 110. The fifth and sixth PR patterns 185b, 185c have different heights from the substrate 110, and a third thickness t13 in the region "E" is greater than a first thickness t11 in the region "D" by an amount corresponding to a thickness of the gate electrode 115. However, the third thickness t13 in the region "E" is substantially same as a second thickness t12 in the region "C" and a fourth thickness t14 in the region "F". Accordingly, the fifth and sixth PR patterns 185b and 185c may be removed at the same time by ashing such that the transparent conductive material layer 158 is exposed. As a result, the present method can decrease a process time of ashing to expose the transparent conductive material layer.

In the related art, the PR pattern in the region "C" or the region "F" has the same height as the PR pattern in the region "D" or the region "E". Accordingly, compared to the related art, the present method requires less ashing time due to the difference between the second and third heights h12 and h13.

The transparent conductive material layer 158 exposed between the fourth to sixth PR patterns 185a, 185b, 185c is removed. Sequentially, the passivation layer 145, the source-drain pattern 139, and the ohmic contact pattern 130 below the transparent conductive material layer 158 are removed. As a result, ohmic contact layers 130a are formed from the ohmic contact pattern 130 on the active layer. The ohmic contact layers 130a are spaced apart from each other. The ohmic contact layers 130a and the active layer 127 are referred to as a semiconductor layer 132. Also, source and drain electrodes 136 and 138 spaced apart from each other are formed on the ohmic contact layers 130a. Accordingly, a thin film transistor (TFT) "Tr" including the gate electrode 115, the gate insulating layer 124, the active layer 127, the ohmic contact layers 130a, the source electrode 136, and the drain electrode 138, is manufactured in the switching region TrA.

In this exemplary embodiment, the first half-transmissive area HTA1 corresponds to the data line 134. However, the second half-transmissive area HTA2 may corresponds to the data line 134 in another exemplary embodiment. In this case, a PR pattern corresponding to the data line 134 may have a thickness less than the above-mentioned case.

Figure 4F:
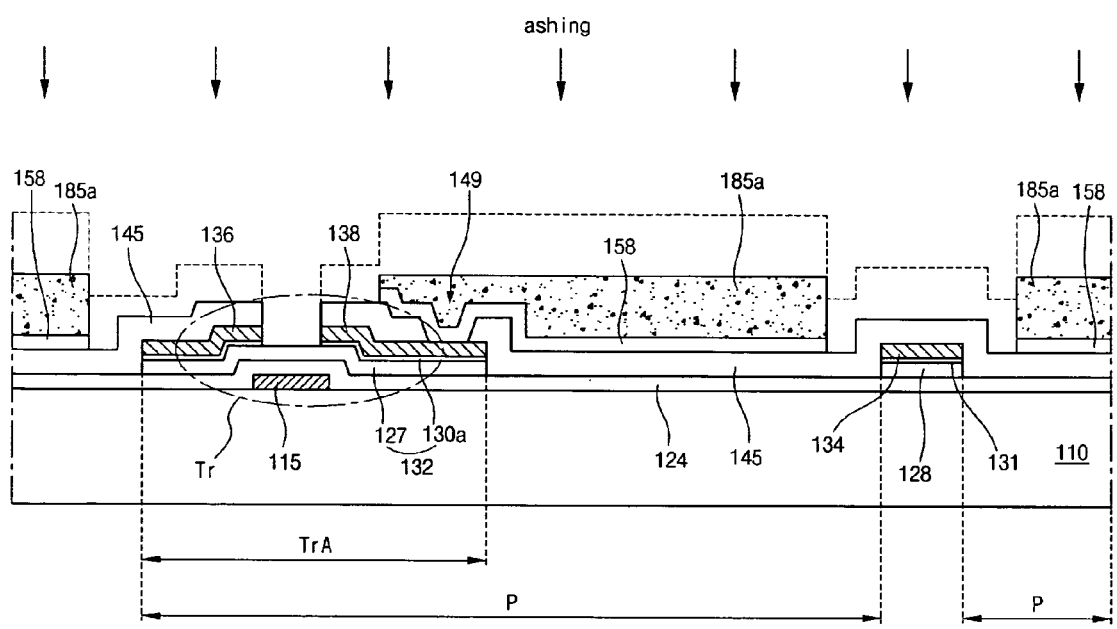

Next, as shown in FIG. 4F, the fifth and sixth PR patterns 185b and 185c are removed from the transparent conductive material layer 158 by ashing such that the transparent conductive material layer 158 corresponding to the fifth and sixth PR patterns 185b and 185c is exposed. Since the fourth PR pattern 185a is thicker than the fifth and sixth PR patterns 185b and 185c, the fourth PR pattern 185a remains on the transparent conductive metal layer 158.

Figure 4G:
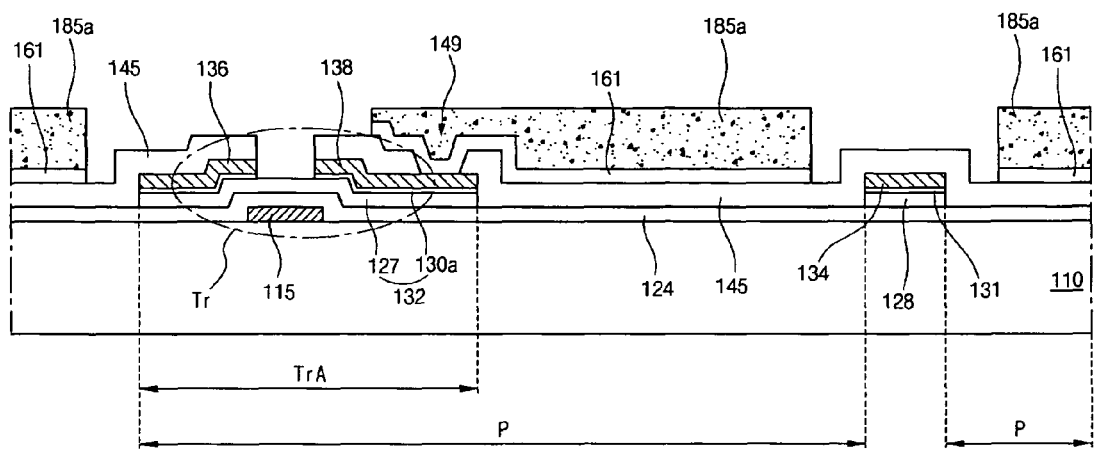

As shown in FIG. 4G, the transparent conductive material layer (158 of FIG. 4F) exposed by the fourth PR pattern 185a is removed from the passivation layer 145. As a result, a pixel electrode 161 is formed from the transparent conductive material layer 158 (158 of FIG. 4F) on the passivation layer 145 in the pixel region P. The pixel electrode 161 contacts the drain electrode 138 of the TFT "Tr" through the drain contact hole 149.

Figure 4H:
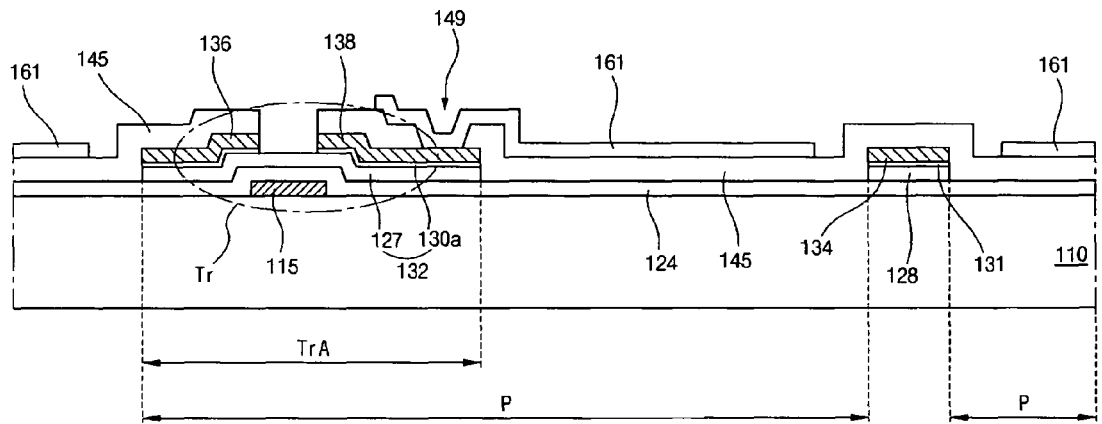

Next, as shown in FIG. 4H, the fourth PR pattern 185a is removed from the pixel electrode 161 such that the array substrate according to the present disclosure is manufactured.

What is claimed is:

1. A photo-mask used for fabricating a photoresist pattern in a process of fabricating an array substrate for a liquid crystal display device, comprising:
   a transmissive area having a first transmittance;
   a blocking area having a second transmittance;
   a first half-transmissive area having a third transmittance;
   a second half-transmissive area having a fourth transmittance,
   wherein the third and fourth transmittances are less than the first transmittance and greater than the second transmittance, respectively, and the third transmittance is greater than the fourth transmittance, and wherein the second half-transmissive area is disposed between the transmissive area and the first half-transmissive area.

2. The photo-mask according to claim 1, wherein at least one of the first half-transmissive area and the second half-transmissive area includes at least one coating layer.

3. The photo-mask according to claim 1, wherein at least one of the first half-transmissive area and the second half-transmissive area includes a plurality of bars, the bars having spaces therebetween.

4. The photo-mask according to claim 1, wherein the first transmittance is about 100 percent.

5. The photo-mask according to claim 1, wherein the second transmittance is about zero percent.

6. The photo-mask according to claim 1, wherein the third transmittance is between about 50 percent and about 60 percent.

7. The photo-mask according to claim 2, wherein the third transmittance is controlled by at least one of a thickness of the coating layer and a number of coating layers.

8. The photo-mask according to claim 1, wherein the fourth transmittance is between about 20 percent and about 40 percent.

9. The photo-mask according to claim 3, wherein the fourth transmittance is controlled by a width of the bars or a distance between the bars.

10. The photo-mask according to claim 1, wherein an upper layer on the array substrate has a first step difference resulting from a first pattern and a second step difference resulting from a second pattern on the first pattern, wherein the first half-transmissive area corresponds to the first step difference and the second half-transmissive area corresponds to the second step difference.

11. The photo-mask according to claim 1, wherein the photo-mask is disposed over a photoresist layer on the array substrate such that at least a portion of a first photoresist pattern below the first half-transmissive area has substantially a same thickness as at least a portion of a second photoresist pattern below the second half-transmissive area.

12. The photomask according to claim 11, wherein the thickness of the portion of the first photoresist pattern is greater than a thickness of a second portion of the first photoresist pattern by an amount corresponding to a thickness of the gate electrode.

* * * * *